US010094859B1

United States Patent
Rao et al.

(10) Patent No.: US 10,094,859 B1
(45) Date of Patent: Oct. 9, 2018

(54) VOLTAGE DETECTOR

(71) Applicant: Invecas, Inc., Santa Clara, CA (US)

(72) Inventors: Venkata N. S. N. Rao, Fremont, CA (US); Prasad Chalasani, San Jose, CA (US); Majid Jalali Far, San Jose, CA (US)

(73) Assignee: Invecas, Inc., Santa Clara, CA (US)

( * ) Notice: Subject to any disclaimer, the term of this patent is extended or adjusted under 35 U.S.C. 154(b) by 0 days.

(21) Appl. No.: 15/654,598

(22) Filed: Jul. 19, 2017

(51) Int. Cl.
*G01R 19/165* (2006.01)

(52) U.S. Cl.
CPC . *G01R 19/16519* (2013.01); *G01R 19/16552* (2013.01)

(58) Field of Classification Search
CPC ............ G01R 19/165; G01R 19/16519; G01R 19/16523; G01R 19/16552
See application file for complete search history.

(56) References Cited

U.S. PATENT DOCUMENTS

| | | | | |
|---|---|---|---|---|
| 4,812,680 A * | 3/1989 | Kawashima | ..... | G01R 19/16519 327/97 |
| 5,495,453 A | 2/1996 | Wociechowski et al. | | |
| 5,898,324 A * | 4/1999 | Yanagisawa | ........... | G11C 5/143 327/77 |
| 7,750,659 B2 * | 7/2010 | Hayashi | ............. | G01R 19/0084 324/750.3 |
| 8,063,674 B2 * | 11/2011 | Kwon | ........................ | G06F 1/24 327/143 |
| 9,274,148 B2 * | 3/2016 | Cheng | ................. | G01R 19/0084 |
| 2006/0103437 A1 * | 5/2006 | Kang | .................... | H03K 17/223 327/143 |
| 2009/0027087 A1 | 1/2009 | Sukup et al. | | |
| 2012/0013365 A1 | 1/2012 | Boas et al. | | |

OTHER PUBLICATIONS

Texus Instruments, Voltage Detector, SLVS392A—Jul. 2001—Revised Jun. 2007.

* cited by examiner

*Primary Examiner* — Patrick O'Neill (74) *Attorney, Agent, or Firm* — Venture Pacific Law, PC (57) ABSTRACT

A power voltage detector comprises voltage sensors for sensing supply voltages; and a logic. The logic combines the sensed supply voltages to generate a logic output indicative of whether the sensed supply voltages have met one or more predefined thresholds. Each of the voltage sensors has diode-connected transistors and passive resistance. The diode-connected transistors and the passive resistance are serially connected for generating an output, where the output is coupled to an input of the logic.

20 Claims, 5 Drawing Sheets

VOLTAGE DETECTOR

FIELD OF INVENTION

The disclosure generally relates to a voltage detector, and more particularly to a power voltage detector having diode connected transistors.

BACKGROUND

A power voltage detector is utilized in an integrated circuit ("IC") for detecting when a supply voltage reaches or exceeds a trip-point voltage. If the supply voltage quickly ramps up and/or down, the integrated circuit can be significantly damaged by the varying supply voltages. For instance, the gate oxide of a metal-oxide-semiconductor field-effect transistor ("MOSFET") can be broken down if the supply voltage ramps up and down. Moreover, once the supply voltage is turned on, it needs a requisite amount of time to become stable. Another concern is of high amplitude glitches in the supply voltage which can damage transistors of the IC. Even very small parametric variations in the IC can cause transistors of the IC to not work properly and not meet expected specifications. Therefore, it's important that the supply voltage is sensed to prevent such variations before being applied to components of the IC.

In a conventional voltage detector, the voltage detector typically uses a comparator to compare a supply voltage with a reference voltage to determine if the supply voltage has reached or exceeded the reference voltage. Subsequent action can be taken based on this result. Thus, the comparator acts as a voltage sensor. The drawbacks of this are that comparators are needed for each supply voltage (which can waste chip area on the IC) and the reference voltage must be generated in order for the comparators to work.

Therefore, it is desirable for providing new methods, systems, and apparatuses for power voltage detection that does not rely on the use of traditional comparators and a reference voltage.

DESCRIPTION OF THE DRAWINGS

The foregoing and other aspects of the disclosure can be better understood from the following detailed description of the embodiments when taken in conjunction with the accompanying drawings.

DETAILED DESCRIPTION OF THE EMBODIMENTS

In the following detailed description of the embodiments, reference is made to the accompanying drawings, which form a part hereof, and in which is shown by way of illustration of specific embodiments in which the disclosure may be practiced. The present disclosure may, however, be embodied in different forms and should not be construed as limited to the embodiments set forth herein.

Figure 1:
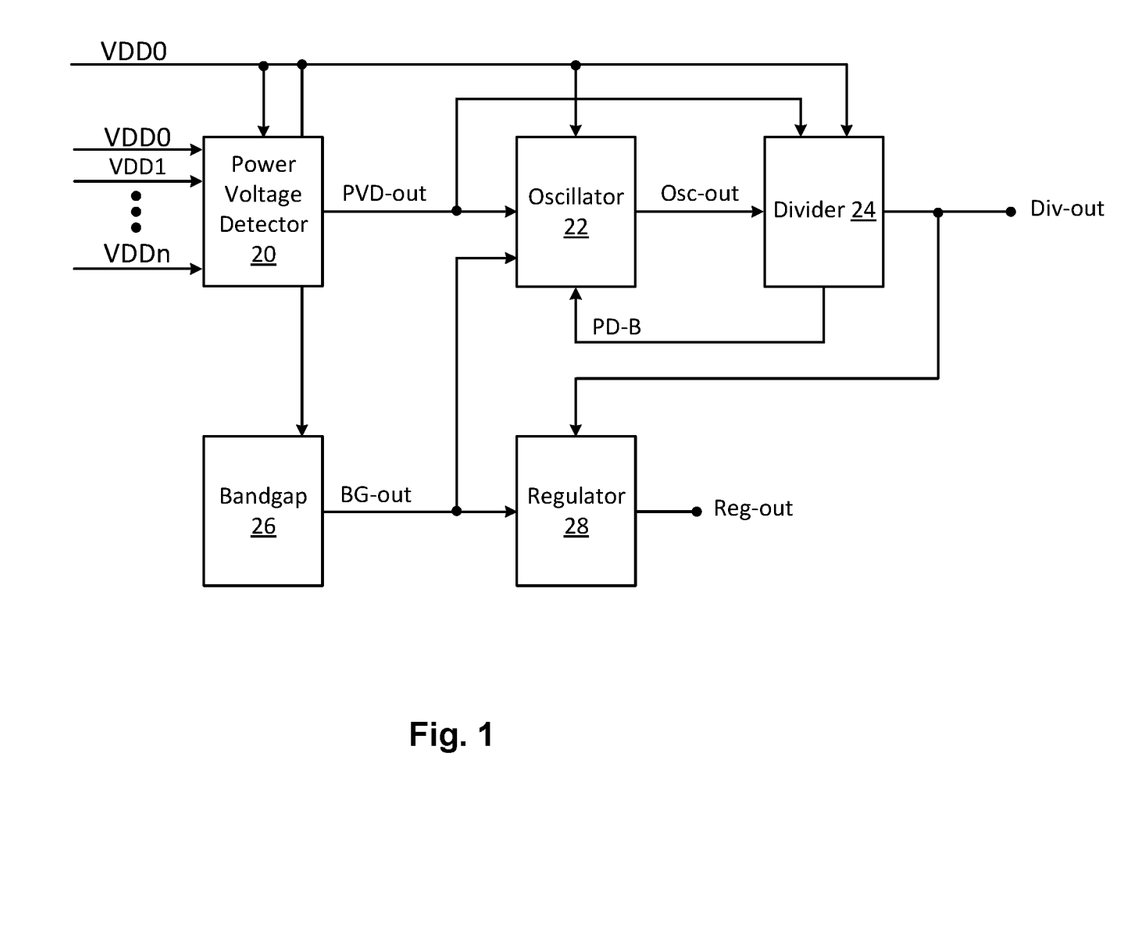
FIG. 1 illustrates a block diagram of a power voltage protector of the present disclosure.

FIG. 1 illustrates a block diagram of a power voltage protector of the present disclosure. In an embodiment, a power voltage protector comprises a power voltage detector 20, an oscillator 22, a divider 24, a bandgap device 26, and a regulator 28. The power voltage detector ("PVD") 20 has inputs for receiving one or more supply voltages to determine whether all of the one or more supply voltages have reached or exceeded one or more threshold voltages. A signal PVD-out can be generated by the power voltage detector 20 to indicate such determination. The PVD-out signal is inputted to the oscillator 22 and the divider 24. The oscillator 22 and the divider 24 are serially connected and act as a buffer to delay the PVD-out signal for a predetermined amount of time. The predetermined amount of time allows for the supply voltages to stabilize.

The divider 24 outputs a signal Div-out based on the PVD-out signal. One of the supply voltages (e.g., VDD0 or any other one of the supply voltages) can be used to power the power voltage detector 20, the oscillator 2, the divider 24, and the bandgap device 26. If and when the divider 24 outputs a logic high signal, a power down signal PD-B is generated by the divider 24 and inputted to the oscillator 22 to turn off of the oscillator 22. Some energy savings can be had by turning off the oscillator 22 once the signal Div-out has reached a high logic level, meaning that all of the supply voltages VDD0-VDDn have reached or exceeded their respective threshold voltages.

The bandgap device 26 provides for a reference current and indicates whether a bandgap voltage has reached a bandgap threshold voltage. If so, the bandgap device generates an enable signal BG-out to indicate whether the bandgap threshold voltage has been reached. The oscillator 22 and the regulator 28 can receive such signal to be either turned off or turned on for operation. If the regulator 28 is in an active state, i.e., both the signal BG-out and the Div-out signal are high, then the regulator 28 outputs a high voltage Reg-out based on one or more of the supply voltages for use by other circuits of the respective IC.

Operationally, supply voltages VDD0-VDDn are injected to the PVD 20. If all of the supply voltages VDD0-VDDn are higher than a threshold voltage ("VTH"), a PVD output PVD-out is set to a high logic value. The PVD output signal can be injected to the oscillator 22 and the divider 24 to provide a delay time to initialize other devices (e.g., the bandgap 26 device). To reduce the power consumption, a power down switch/signal PD-B can be used to turn off the oscillator 22 when an output of the divider 24 is high. Furthermore, an additional bandgap ("BG") switch/signal can be employed in the oscillator 22 to be sure that the bandgap block 26 is working in a proper state, i.e., the output of the bandgap 26 is a high logic value. When all of the supply voltages VDD0-VDDn are stable and high, the divider 24 output goes high. That Div-out signal is sent to the regulator 28 for activation.

To aid in the understanding of the present disclosure, only a single regulator is shown in FIG. 1. However, it is understood by a person having ordinary skill in the art that multiple regulators can be used in conjunction with the present disclosure to regulate a single power supply or multiple power supplies. It can be appreciated that the threshold voltage (also referred to as a gate voltage) can be a minimum required voltage to create a conducting path between a source and a drain of a MOS transistor.

The present embodiment illustrated in FIG. 1 shows multiple supply voltages, but it is understood that any number of supply voltages can be received as input to the power voltage detector in accordance with the present disclosure. For instance, in some IC designs, there may only be a single supply voltage inputted to the power voltage detector; while in other IC designs, there may be twenty supply voltages used and inputted to the power voltage detector. It is understood that the present disclosure can be used to receive any number of supply voltages.

Furthermore, the present embodiment illustrated in FIG. 1 can be located on-chip in an IC circuit or located off-chip. A person having ordinary skill in the art can adapt the present disclosure for either application or other related applications.

Figure 2:
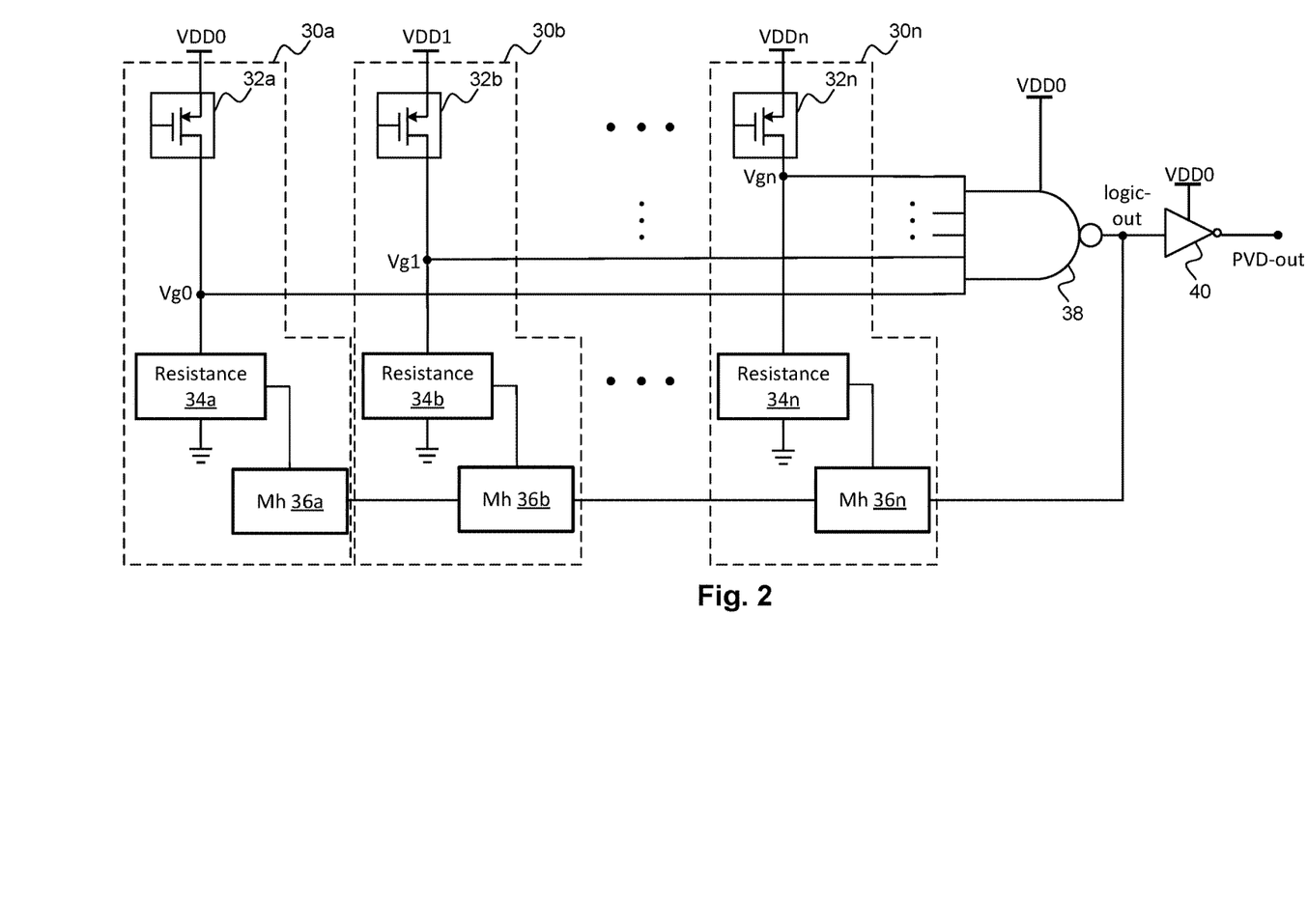
FIG. 2 illustrates a block diagram of an embodiment of a power voltage detector of the present disclosure.

FIG. 2 illustrates a block diagram of an embodiment of a power voltage detector of the present disclosure. In an embodiment, a power voltage detector comprises voltage sensors 30a-30n and a logic 38 for indicating whether all of the sensed voltages have reached one or more threshold voltages. The power voltage detector can further comprise an inverter 40 for inverting the output of the logic 38 to generate a power voltage detector output PVD-out. The inverter 40 can be optional and dependent on a design of the IC system and how the information from the logic 38 is conveyed to other components of the IC system. Each of the power supply voltages VDD0-VDDn is coupled to one of the voltage sensors 30a-30n having a one-to-one mapping. Thus, if there are ten supply voltages, then there are ten voltage sensors.

Each of the voltage sensors 30a-30n comprises a diode-connected transistor circuit, a resistance, and a hysteresis circuit. The diode-connected transistor circuit and the resistance are serially connected across the respective supply voltage and a low voltage potential. The hysteresis circuit is coupled to the resistance and to other hysteresis circuits. The serial connection between the diode-connected transistor and the resistance provide for a sensed voltage output, which is inputted to the logic 38.

For instance, the voltage sensor 30a comprises a diode-connected transistor circuit 32a, resistance 34a, and a hysteresis circuit ("Mh") 36a. The diode-connected transistor circuit 32a and the resistance 34a are serially connected across the supply voltage VDD0 and ground. The hysteresis circuit 36a is coupled to the resistance 34a and other hysteresis circuits of other voltage sensors 30b-30n. The serial connection between the diode-connected transistor 32a and the resistance 34a provide for a sensed voltage Vg0, which is inputted to the logic 38.

Additionally, the voltage sensor 30b comprises a diode-connected transistor circuit 32b, resistance 34b, and a hysteresis circuit 36b, and coupled together in a like manner to generate a sensed voltage Vg1. The voltage sensor 30n comprises a diode-connected transistor circuit 32n, resistance 34n, and a hysteresis circuit 36n, and coupled together in a like manner to generate a sensed voltage Vgn. The sensed voltage outputs Vg1 and Vgn are coupled to inputs of the logic 38. Additional voltage sensors can be included as needed to pair with one of the supply voltages for generating respective sensed voltages.

The logic 38 can either AND, NAND, or perform another logic operation on the sensed voltages Vg1-Vgn to generate a logic-out signal. The logic-out signal is fed back to operate the hysteresis circuits 36a-36n and is further inputted to the inverter 40. The inverter 40 can be powered by one of the supply voltages and generates an output of the power voltage detector by inverting the logic-out signal. As previously stated, the inverter 40 is an optional element of the power voltage detector and is dependent on the manner in which the logic 38 is implemented and the manner in which the PVD-out signal is used to indicate whether all of the sensed voltage have reached a high voltage potential.

Figure 3:
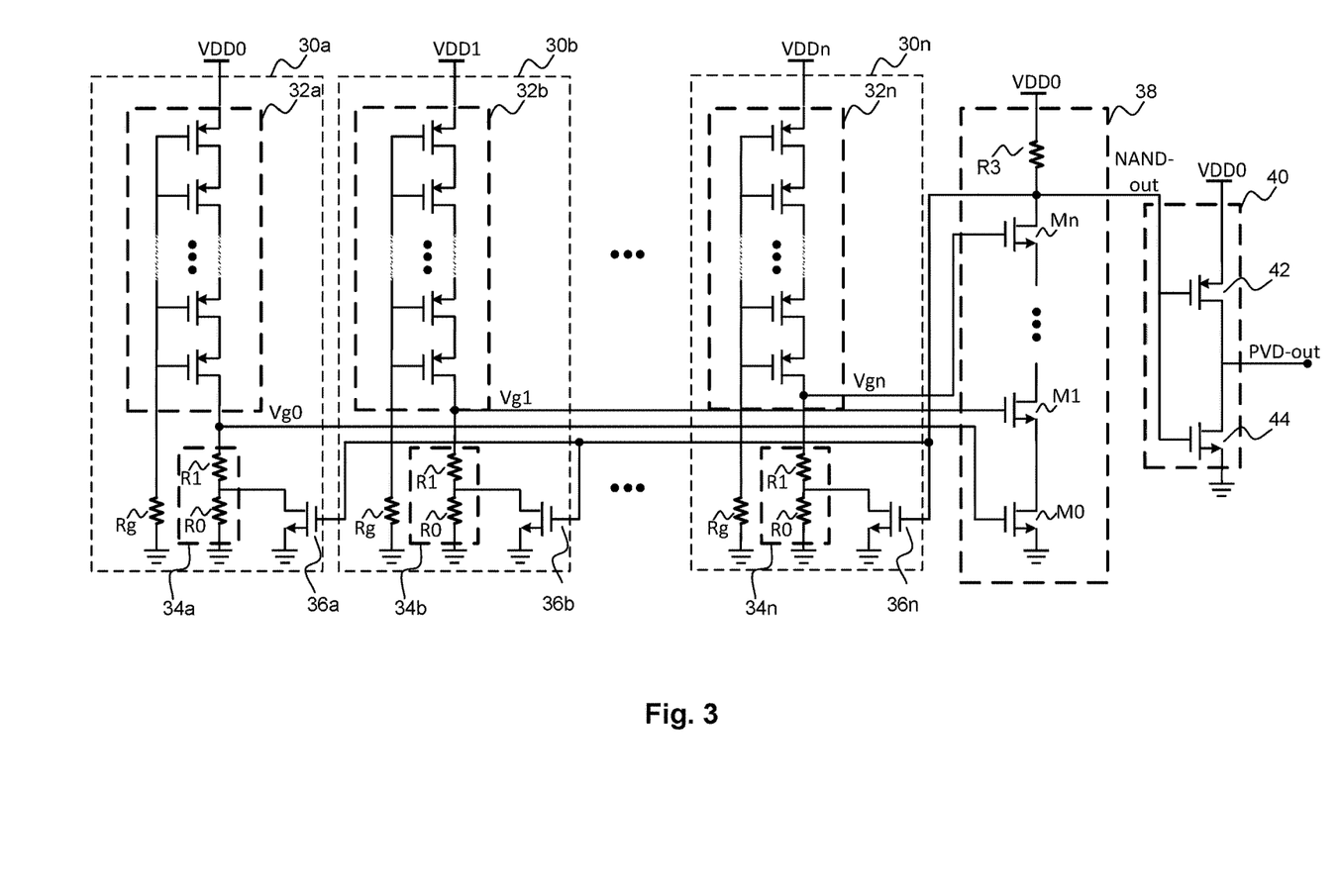
FIG. 3 illustrates a circuit diagram of an embodiment of a power voltage detector of the present disclosure.

FIG. 3 illustrates a circuit diagram of an embodiment of a power voltage detector of the present disclosure. In an embodiment, the diode-connected transistors 32a-32n of the power voltage detector can be implemented by PMOS transistors that are serially connected across a respective supply voltage and a respective resistance 34a-34n. The gates of the PMOS transistors are coupled to ground via a resistor. Furthermore, the hysteresis circuits 36a-36n of the power voltage detector can be implemented by NMOS transistors. The resistances 34a-34n of the power voltage detector can be implemented by one or more resistors. The logic 38 of the power voltage detector can be implemented by a serially connected NMOS transistors M0-Mn and a resistor R3. The logic-out signal (or NAND-out signal in this particular case) is fed to the inverter 40 and to the gates of the transistors used to implement the hysteresis circuits 36a-36n. The inverter 40 of the power voltage detector can be implemented by serially-connected NMOS transistor 44 and a PMOS transistor 42, where the serial connection generates the PVD-out signal.

In particular and referring to FIG. 3, the voltage sensor 30a comprises serially-connected PMOS transistors 32a, a resistor Rg, resistances 34a, and an NMOS transistor 36a to provide for hysteresis. The gates of the PMOS transistors 32a are coupled to ground via the resistor Rg. The resistors R1 and R0 of the resistances 34a are serially connected with the serially-connected PMOS transistors 32a, where the serial connection between the resistor R1 of the resistances 34a and the serially-connected PMOS transistors 32a generates the sensed voltage Vg0. The NMOS transistor 36a is coupled across a serial connection between the resistors R1 and R0 of the resistances 34a and ground. The gate of the NMOS transistor 36a is coupled to the NAND-out signal from the logic 38.

Likewise, the voltage sensor 30b comprises serially-connected PMOS transistors 32b, a resistor Rg, resistances 34b, and an NMOS transistor 36b to provide for hysteresis. The gates of the PMOS transistors 32b are coupled to ground via the resistor Rg. The resistors R1 and R0 of the resistances 34b are serially connected with the serially-connected PMOS transistors 32b, where the serial connection between the resistor R1 of the resistances 34b and the serially-connected PMOS transistors 32b generates the sensed voltage Vg1. The NMOS transistor 36b is coupled across a serial connection between the resistors R1 and R0 of the resistances 34b and ground. The gate of the NMOS transistor 36b is coupled to the NAND-out signal from the logic 38.

Additionally, the voltage sensor 30n comprises serially-connected PMOS transistors 32n, a resistor Rg, resistances 34n, and an NMOS transistor 36n to provide for hysteresis. The gates of the PMOS transistors 32n are coupled to ground via the resistor Rg. The resistors R1 and R0 of the resistances 34n are serially connected with the serially-connected PMOS transistors 32n, where the serial connection between the resistor R1 of the resistances 34n and the serially-connected PMOS transistors 32n generates the sensed voltage Vgn. The NMOS transistor 36n is coupled across a serial connection between the resistors R1 and R0 of the resistances 34n and ground. The gate of the NMOS transistor 36n is coupled to the NAND-out signal from the logic 38.

The logic 38 can be implemented to perform a NAND logic-like function. As such, the logic 38 can comprise a resistor R3 and NMOS transistors M0-Mn. The resistor R3 and the NMOS transistors M0-Mn are serially-connected across a supply voltage and ground. Each of the transistors M0-Mn have its respective gate coupled to one of the sensed voltages Vg0-Vgn. For instance, the sensed voltage Vg0 is coupled to the gate of the transistor M0; the sensed voltage Vg1 is coupled to the gate of the transistor M1; the sensed voltage Vgn is coupled to the gate of Mn. The serial connection between the resistor R3 and the transistor Mn provides for an output NAND-out of the logic 38. The output NAND-out is coupled to the gates of the transistors 36a-36n for hysteresis and coupled to gates of the transistors 42 and 44. The inverter 40 can be implemented by the PMOS transistor 42 and the NMOS transistor 44, where the transistors 42 and 44 are serially connected across a supply voltage and ground to generate an output PVD-out. The output PVD-out signal is an inverted signal of the NAND-out output.

Additional voltage sensors and NMOS transistors of the logic 38 can be added as needed by the design of a respective IC design in accordance with the present disclosure. Additionally, a lesser number of voltage sensors and NMOS transistors of the logic 38 can also be implemented as well depending on the respective IC design in accordance with the present disclosure. A person having ordinary skill in the art can appreciate that such varying numbers of voltage sensors can be used in conjunction with the present disclosure.

Operationally, each diode-connected branch output Vg0, Vg1, . . . , Vgn is connected to a gate of a transistor M0, M1, . . . , Mn of the logic 38, where the logic acts as a NAND-like logic. When all the branches meet a threshold level (i.e., generate a proper bias voltage to turn on the transistors of the logic 38, the logic 38 outputs a low logic value which is inverted to a high logic value to indicate that all of the supply voltages have reached a threshold voltage. Each diode-connected branch along with resistors of R0 and R1 can provide for a voltage divider for generating the sensed voltages Vg0, Vg1, . . . , Vgn. All the transistors of the NAND-like logic 38 can be on if all voltage divider outputs provide a well-biased voltage for the gates of the NAND-like logic 38.

To generate a hysteresis in ramping up and down of supply voltages, transistors can be utilized in the PVD circuit. When supply voltages are ramping up, the NAND-out signal can rise proportionally to the ramping supply voltages since gates of the transistors of the NAND-like logic 38. In this state, the hysteresis switches are on, and the resistor of R0 is eliminated. When the supply voltages increase pass the threshold voltage(s) of the transistors to turn on the gates of the transistors of the gates of NAND logic 38, the NAND-out signal goes low. The hysteresis switches in turn will be off, and resistors of R0 adds to R1 (i.e., R0+R1). In ramping down of supply voltages, the circuit behavior is vice versa and the hysteresis switches will be on and the voltage dividers are reduced.

Each branch of diode connected transistors can connected to different supply voltages. Thus, there is no limitation in number of supply voltages. Resistances of R0 and R1 are determined by regarding connected supply and required hysteresis. Passive resistances R0 and R1 can be used in the PVD block instead of active MOS transistors due to providing a consistent voltage under process, voltage and temperature ("PVT") condition. Resistor pulldown can be used to make sure the PVD starts with a default state of low irrespective of supply voltage(s). Hysteresis switches Mh0, Mh1, . . . , and Mhn provide hysteresis between ramping up and down of supply voltages.

Figure 4:
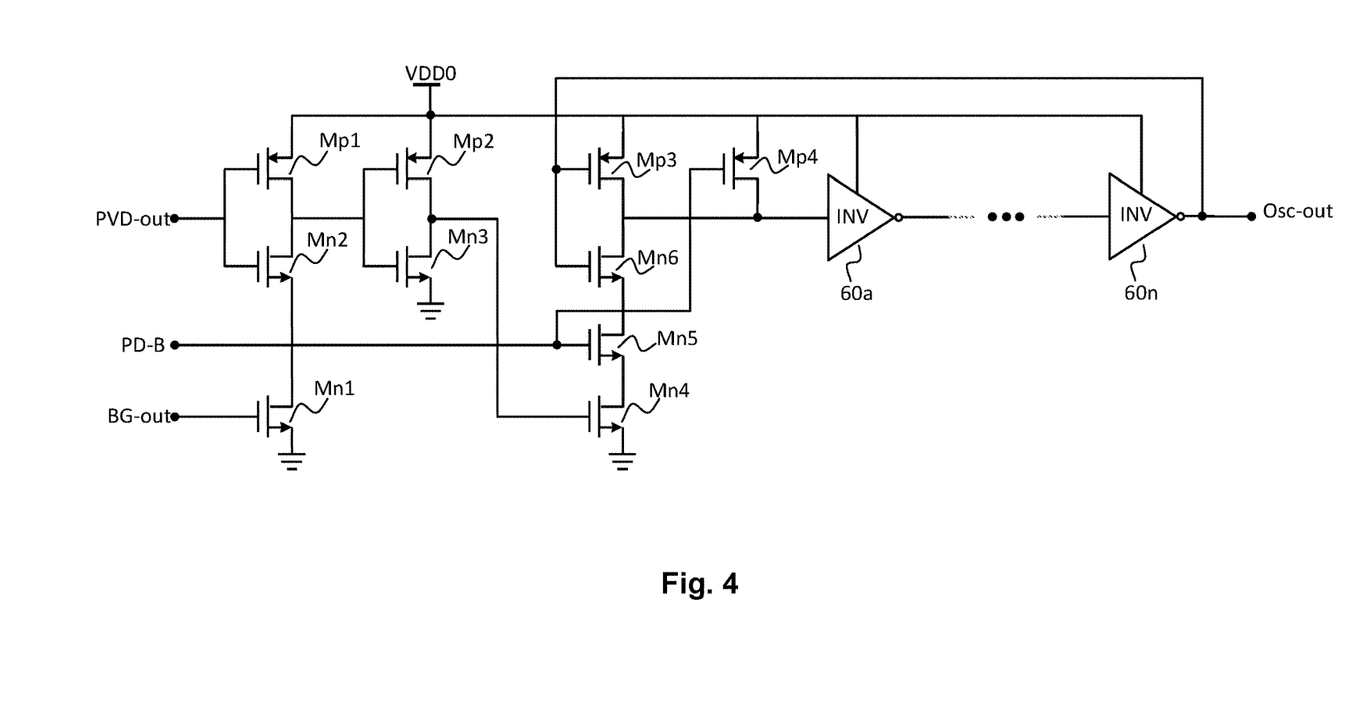
FIG. 4 illustrates a circuit diagram of an embodiment of an oscillator of the present disclosure.

FIG. 4 illustrates a circuit diagram of an embodiment of an oscillator of the present disclosure. An oscillator of the present disclosure can comprise PMOS transistors Mp1-Mp4, NMOS transistors Mn1-Mn6, and inverters 60a-60n. The transistors Mp1, Mn2, and Mn1 can be serially connected across a supply voltage and ground. The gates of transistors Mp1 and Mn2 are coupled to the PVD output PVD-out. The gate of the transistor Mn1 is coupled to the bandgap output BG-out.

The transistors Mp2 and Mn3 are serially connected across the supply voltage and ground. The gates of the transistors Mp2 and Mn3 are coupled to the serial connection between transistors Mp1 and Mn2. The serial connection between the transistors Mp2 and Mn3 is coupled to the gate of the transistor Mn4.

The transistors Mp3, Mn6, Mn5, and Mn4 are serially connected across the supply voltage and ground. The gates of the transistors Mp3 and Mn6 are coupled to the oscillator output Osc-out. The serial connection between the transistor Mp3 and Mn6 is coupled to an input of the inverter 60a. The transistor Mp4 is coupled across the supply voltage and the input of the inverter 60a. The gates of the transistors Mn5 and Mp4 are coupled to a control signal to power down PD-B.

The inverter 60a through inverter 60n are serially connected to generate the output Osc-out. The inverters 60a-60n can be powered by the supply voltage. To aid in the understanding of the present disclosure, only two inverters are shown in FIG. 4, but it is understood that various numbers of inverters can be used to implement the oscillator depending on the design in accordance with the present disclosure. Furthermore, the present embodiment of an oscillator described herein is only meant for illustrative purposes and in no way meant to limit the present disclosure to such embodiment. It is understood by a person having ordinary skill in the art that other oscillator implementations can be used in conjunction with the present disclosure.

Operationally, the PVD output signal can be applied to an oscillator. The oscillator can be an inverter-based ring oscillator. In the oscillator, three signals can be utilized, including PVD-out, PD-B, and BG-out. The oscillator can start to oscillate when all three signals are high. The PVD-out signal generated by the PVD block can be high when all the supply voltages have reached a consistent value greater than a threshold voltage of the gate transistors of the NAND logic. The PD-B signal, generated by the divider block, can be used to power down the oscillator and reduce its power consumption. The BG-out signal can be generated by the bandgap block. Every system can have at least one current bandgap to generate a reference current. The oscillator can be activated when the bandgap works properly and sends a high signal to the PVD oscillator.

Figure 5:
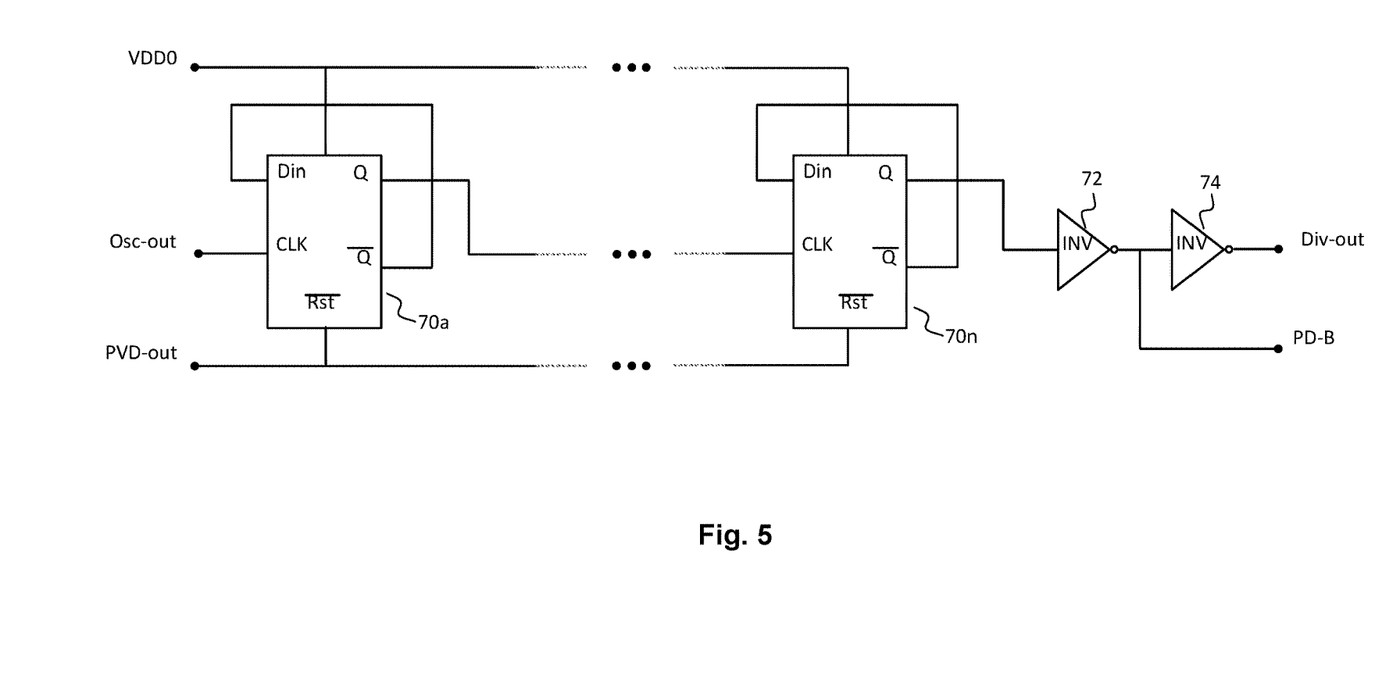
FIG. 5 illustrates a block diagram of an embodiment of a divider of the present disclosure.

FIG. 5 illustrates a block diagram of an embodiment of a divider of the present disclosure. The divider of the present disclosure can comprise flip-flops 70a-70n and inverters 72 and 74. The flip-flops 70a-70n can be serially connected with the Osc-out signal inputted to a clock input CLK of the flip-flop 70a. A negated data output $\overline{Q}$ and a data input Din of the flip-flop 70a are coupled together. The data out Q coupled is coupled to a clock input CLK of a next one of the flip-flops (not shown) along the serial connection. The next ones of the flip-flops (not shown) can be connected in a like manner with their data input Din coupled with their negated data output $\overline{Q}$, have a clock input CLK coupled to the data output Q of a previous flip-flop, and have a data output Q coupled to a clock input CLK of a successive one of the flip-flops. The number of flip-flops serially connected can be dependent on the amount to divide on an inputted signal. To aid in the understanding of the present disclosure, two flip-flops are illustrated. However, it's understood other numbers of flip-flops can be used to generate the predefined amount for the division. The flip-flops 70a-70n can be powered by a supply voltage and have each of their reset inputs coupled to the output of the power voltage detector PVD-out.

The last flip-flop 70n of the serially-connected flip-flops can have its data output Q coupled to an input of the inverter 72. An output PD-B of the inverter 72 is coupled to an input of the inverter 74. The PD_b signal can be used as a control signal to power down other components. An output Div-out of the inverter 74 generates the output for the respective divider circuit.

The present embodiment of a divider described herein is only meant for illustrative purposes and in no way meant to limit the present disclosure to such embodiment. It is understood by a person having ordinary skill in the art that other divider implementations can be used in conjunction with the present disclosure. For instance, a frequency divider ("FD" or divider) can include two master-slave flip-flop circuits. The structure of the FD can be a conventional structure having master-slave flip-flop circuits. The number of stages of flip-flops depends on the application and delay time to initialize the devices, like a bandgap.

The FD along with the oscillator generate a time period of delay to allow the supply voltages are completely stable and the devices are ready to supply with consistent supply voltages. The input and output pins of the divider can be as follows: an Osc-out, a PVD-out, and a PD-B, and a Div-out. The oscillator output is injected through the divider, then the signal is divided by the number of stages. When the PVD block is off and its output is low, the divider will be off to reduce power consumption. When the divider output is high, the signal is inverted and sent to the oscillator to power down.

While the disclosure has been described with reference to certain embodiments, it is to be understood that the disclosure is not limited to such embodiments. Rather, the disclosure should be understood and construed in its broadest meaning, as reflected by the following claims. Thus, these claims are to be understood as incorporating not only the apparatuses, methods, and systems described herein, but all those other and further alterations and modifications as would be apparent to those of ordinary skilled in the art.

We claim:

1. A power voltage detector comprises:
voltage sensors for sensing supply voltages; and
a logic for determining whether the sensed supply voltages have reached one or more threshold voltages,
wherein the logic has one or more inputs,
wherein each of the voltage sensors has diode-connected transistors and passive resistance,
wherein the diode-connected transistors and the passive resistance are serially connected for generating a voltage sensor output, and
wherein the voltage sensor output is coupled to one of the inputs of the logic.

2. The power voltage detector of claim 1, wherein said each of the voltage sensors further comprise a switch for providing hysteresis, wherein the switch is coupled to the passive resistance, and wherein the switch is operated based on the output of the logic.

3. The power voltage detector of claim 2, wherein the switch is a transistor.

4. The power voltage detector of claim 1, wherein the logic is a NAND logic block and wherein the NAND logic block has inputs for each of the sensed supply voltages.

5. The power voltage detector of claim 1, wherein the logic comprises a resistor and transistors, wherein the resistor and the transistors are serially connected, and wherein the gates of the transistors are coupled to the sensed supply voltages.

6. The power voltage detector of claim 1, further comprising an inverter, wherein the output of the logic is coupled to an input of the inverter.

7. The power voltage detector of claim 1 wherein the passive resistance comprises a first resistor and a second resistor, and wherein the first resistor and the second resistor are serially connected for providing a voltage divider function.

8. The power voltage detector of claim 1 wherein said each of the voltage sensors further comprises a third resistor, and wherein gates of the diode-connected transistors are coupled to the ground via the third resistor.

9. A power voltage protector, comprises:
a power voltage detector ("PVD") comprising:
voltage sensor for sensing supply voltages; and
a logic for combining the sensed supply voltages to generate a PVD output indicative of whether the sensed supply voltages have met one or more predefined thresholds,
wherein each of the voltage sensors has diode-connected transistors and passive resistance,
wherein the diode-connected transistors and the passive resistance are serially connected for generating an output, and
wherein the output is coupled to an input of the logic;
an oscillator;
a divider;
a bandgap circuit for generating a bandgap output; and
at least one regulator for generating a regulator output,
wherein inputs of the oscillator are coupled to the bandgap output, the PVD output and a power down control signal,
wherein the output of the oscillator and the PVD output are coupled to inputs of the divider for generating a divider output, and
wherein the divider output and the bandgap output are coupled to inputs of the at least one regulator for generating a regulator output.

10. The power voltage protector of claim 9, wherein said each of the voltage sensors further comprise a switch for providing hysteresis, wherein the switch is coupled to the passive resistance, and wherein the switch is operated based on the output of the logic.

11. The power voltage protector of claim 10, wherein the switch is a transistor.

12. The power voltage protector of claim 9, wherein the logic is a NAND logic block and wherein the NAND logic block has inputs for each of the sensed supply voltages.

13. The power voltage protector of claim 9, wherein the logic comprises a resistor and transistors, wherein the resistor and the transistors are serially connected, and wherein the gates of the transistors are coupled to the sensed supply voltages.

14. The power voltage protector of claim 9, further comprising an inverter, wherein the output of the logic is coupled to an input of the inverter.

15. The power voltage protector of claim 9, wherein the passive resistance comprises a first resistor and a second resistor, and wherein the first resistor and the second resistor are serially connected for providing a voltage divider function.

16. The power voltage protector of claim 9, wherein said each of the voltage sensors further comprises a third resistor, and wherein gates of the diode-connected transistors are coupled to the ground via the third resistor.

17. A power voltage detector comprises:
   means for voltage sensing of supply voltages; and
   means for applying a NAND logic function on the sensed supply voltages to generate a logic output indicative of whether the sensed supply voltages have met one or more predefined thresholds,
   wherein said means for voltage sensing has voltage sensors,
   wherein each of the voltages sensors comprises diode-connected transistors and means for voltage dividing,
   wherein the diode-connected transistors and the means for voltage dividing are serially connected for generating an output, and
   wherein the output is coupled to an input of the logic.

18. The power voltage detector of claim 17, wherein said each of the voltage sensors further comprise a transistor for providing hysteresis, wherein the transistor is coupled to the passive resistance, and wherein the transistor is operated based on the output of the logic.

19. The power voltage detector of claim 17, wherein the means for applying the NAND logic function comprises a resistor and transistors, wherein the resistor and the transistors are serially connected, and wherein the gates of the transistors are coupled to the sensed supply voltages.

20. The power voltage detector of claim 17, further comprising a means for inverting an output for the means for applying the NAND logic function.

* * * * *